(12) United States Patent
Widmer et al.

(10) Patent No.: US 9,697,872 B2
(45) Date of Patent: Jul. 4, 2017

(54) HIGH SPEED SERIAL PERIPHERAL INTERFACE MEMORY SUBSYSTEM

(75) Inventors: Kevin Widmer, San Carlos, CA (US); Anthony Le, Campbell, CA (US); Cliff Zitlaw, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/313,699

(22) Filed: Dec. 7, 2011

(65) Prior Publication Data

US 2013/0151751 A1  Jun. 13, 2013

(51) Int. Cl.
```
G06F 13/00      (2006.01)
G11C 5/02       (2006.01)
G06F 13/42      (2006.01)
G06F 13/16      (2006.01)
```
(52) U.S. Cl.
CPC ............ *G11C 5/02* (2013.01); *G06F 13/1694* (2013.01); *G06F 13/4291* (2013.01)

(58) Field of Classification Search
CPC combination set(s) only.
See application file for complete search history.

(56) References Cited

U.S. PATENT DOCUMENTS

| | | | |
|---|---|---|---|
| 2002/0118593 A1 | 8/2002 | Takemae | |
| 2004/0109463 A1* | 6/2004 | Friesen et al. | 370/402 |
| 2004/0199674 A1* | 10/2004 | Brinkhus | 710/1 |
| 2005/0068812 A1* | 3/2005 | Oh | 365/193 |
| 2005/0213421 A1 | 9/2005 | Polizzi et al. | |
| 2008/0059768 A1* | 3/2008 | Hung et al. | 712/43 |
| 2008/0147940 A1 | 6/2008 | Kao et al. | |
| 2008/0149740 A1 | 6/2008 | Kao et al. | |
| 2008/0165589 A1 | 7/2008 | Hung et al. | |
| 2009/0138673 A1* | 5/2009 | Wilson et al. | 711/211 |
| 2009/0187689 A1 | 7/2009 | Roohparvar | |
| 2010/0049878 A1* | 2/2010 | Yu et al. | 710/11 |
| 2011/0099301 A1* | 4/2011 | Moallem et al. | 710/22 |
| 2011/0153973 A1 | 6/2011 | Kim | |
| 2011/0258364 A1* | 10/2011 | Leung | 711/103 |
| 2012/0110246 A1* | 5/2012 | Rolandi et al. | 711/103 |

OTHER PUBLICATIONS

International Search Report for International Application No. PCT/US12/68467 dated Mar. 27, 2013; 2 pages.

(Continued)

*Primary Examiner* — Charles Rones
*Assistant Examiner* — Han Doan (57) ABSTRACT

A memory subsystem is disclosed. The memory subsystem includes a serial peripheral interface (SPI) double data rate (DDR) volatile memory component, a serial peripheral interface (SPI) double data rate (DDR) non-volatile memory component coupled to the serial peripheral interface (SPI) double data rate (DDR) volatile memory component and a serial peripheral interface (SPI) double data rate (DDR) interface. The serial peripheral interface (SPI) double data rate (DDR) interface accesses the serial peripheral interface (SPI) double data rate (DDR) volatile memory component and the serial peripheral interface (SPI) double data rate (DDR) non-volatile memory component where data is accessed on leading and falling edges of a clock signal.

17 Claims, 5 Drawing Sheets

(56) References Cited

OTHER PUBLICATIONS

Written Opinion of the International Searching Authority for International Application No. PCT/US2012/068467 mailed Mar. 26, 2013; 4 pages.
European Office Action for Application No. 12854967.2 dated May 29, 2015; 1 page.
SIPO Office Action for Application No. 201280069204.X dated Jun. 18, 2016; 6 page.
SIPO Office Action for Application No. 201280069204.X dated Oct. 8, 2016; 6 page.
JPO Office Action for Application No. 2014-546120 dated Feb. 25, 2017; 3 page.
JPO Office Action for Application No. 2014-546120 dated Mar. 24, 2017; 164 page.
Qamrul Hasan, et al., "Improving performance using SPI-DDR NOR flash memory," EETimes, Sep. 21, 2011; 3 pages.
SIPO Office Action for International Application No. 201280069204.X dated Mar. 31, 2017; 12 pages.

* cited by examiner

HIGH SPEED SERIAL PERIPHERAL INTERFACE MEMORY SUBSYSTEM

BACKGROUND

Consumer electronic products such as televisions, digital cameras, cellular telephones, media content players, tablet PCs, etc., are designed, manufactured and marketed for the purpose of satisfying the substantial consumer demand for electronic equipment that is intended for everyday use. Data storage components play an important role in the operation of such devices. Data storage components can include RAM, PSRAM, ROM, flash memory, etc.

Flash memory is non-volatile computer memory that can be electrically erased and reprogrammed. Flash memory is primarily used in memory cards and USB flash drives for general storage and transfer of data between computers and other digital products. Flash memory is a specific type of Electrically Erasable Programmable Read-Only Memory (EEPROM) that is erased and programmed in large blocks. Example applications include data storage for personal digital assistants (PDAs), laptop computers, digital audio players, digital cameras and mobile phones. Other applications include game consoles, where flash memory can be used instead of other types of EEPROMs or battery-powered SRAM for game save data.

PSRAM is dynamic RAM with built-in refresh and address-control circuitry to make it behave similarly to static RAM (SRAM). It combines the high density of DRAM with the ease of use of true SRAM. PSRAM is used in the Apple iPhone™ and other embedded systems.

In electronic applications where the memory subsystem includes both volatile (e.g., RAM) and non-volatile (e.g., flash) memory components, the memory components can either share the same bus or use separate busses. Memories that share the same bus need to have the same pin-out and throughput performance, since it can be difficult for a processor to manage memory components of varying speeds on the same bus. An example of a bus sharing memory subsystem is a memory subsystem that includes parallel NOR flash (non-volatile) and PSRAM (volatile) memories. In memory subsystems that use separate buses, the processor can manage each of the memory components independently, without bus contentions. However, independent bus systems have to support separate traces for both volatile and non-volatile memory components. It should be appreciated that independent bus subsystems are optimized for high throughput performance and place less of a focus on cost (such memories include parallel NOR Flash and Dynamic RAM memories). In contrast, bus sharing systems save costs that are directly related to the reduced number of traces that they feature.

Conventional bus sharing subsystems that feature a parallel NOR flash/PSRAM infrastructure can require 40 or more traces in order to match the data, address, and control lines provided by a memory interface. Reducing the component cost of packages that contain parallel NOR flash and PSRAM components is achieved by using smaller packages and/or reducing the size of the die upon which these circuits are formed. However, reductions in the size of the package is limited by the pads required to service the die as a die cannot be reduced in size beyond that which is necessary to accommodate required pads. Likewise, the number of required traces limit achievable package size reductions. Accordingly, although conventional parallel NOR flash/PSRAM memories provide reduced traces as compared to independent bus systems, the prospect for significant additional reductions as will be required to meet the continuing demand for decreased package size and increased cost savings is limited.

SUMMARY

Because of the die size that is required, conventional parallel NOR flash/PSRAM memory packages offer limited prospects for size reductions of the type that may be required to meet the continuing demand for decreased package sizes and increased cost savings. A memory subsystem having a serial peripheral interface (SPI) that requires a smaller than conventional die is provided that helps to address these shortcomings. However, the claimed embodiments are not limited to implementations that address these shortcomings. The memory subsystem includes a serial peripheral interface (SPI) double data rate (DDR) volatile memory component, a serial peripheral interface (SPI) double data rate (DDR) non-volatile memory component and a serial peripheral interface (SPI) double data rate (DDR) interface. The serial peripheral interface (SPI) double data rate (DDR) interface accesses the serial peripheral interface (SPI) double data rate (DDR) volatile memory component and the serial peripheral interface (SPI) double data rate (DDR) non-volatile memory component where data is accessed on leading and falling edges of a clock signal.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1:
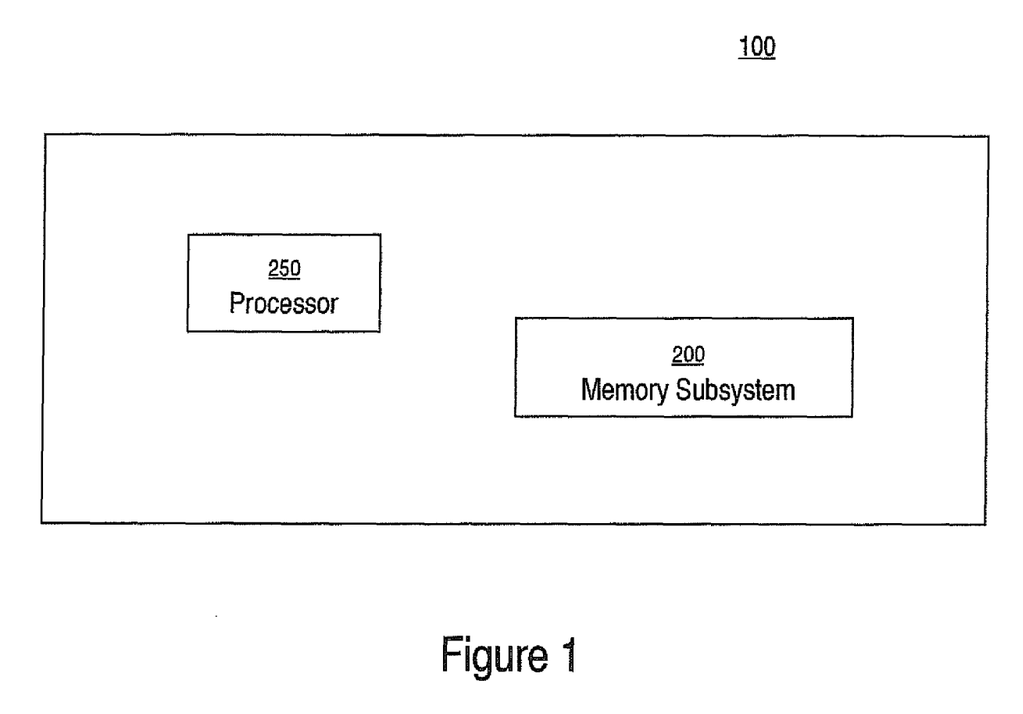
FIG. 1 shows an electronic device that includes a high speed serial peripheral interface (SPI) memory subsystem according to one embodiment.

Exemplary Operating Environment of High Speed Serial Peripheral Interface Memory Subsystem According to One Embodiment FIG. 1 shows an electronic device 100 that includes a high speed serial peripheral interface (SPI) memory subsystem 200 according to one embodiment. The design of the high speed SPI memory subsystem of exemplary embodiments provides electronic device 100 with a memory subsystem that delivers a throughput performance that is similar to that of conventional parallel memory subsystems but with a lower pin count. Electronic device 100 can include but is not limited to televisions, digital cameras, cellular telephones, media content players and tablet PCs. The electronic device 100 of the embodiment that is shown in FIG. 1 includes high speed SPI memory subsystem 200 and processor 250.

Referring to FIG. 1, high speed SPI memory subsystem 200 is the data storage subsystem of electronic device 100 and provides memory support for its operation. High speed SPI memory subsystem 200 is accessed by electronic device processor 250 via a double data rate (DDR) interface (e.g., discussed below). The DDR interface reads and writes data on both the rising and falling edges of a clock cycle. The structural composition of the SPI memory subsystem 200 is described herein below in detail with reference to FIG. 2.

High Speed Serial Peripheral Interface Memory Subsystem

Figure 2:
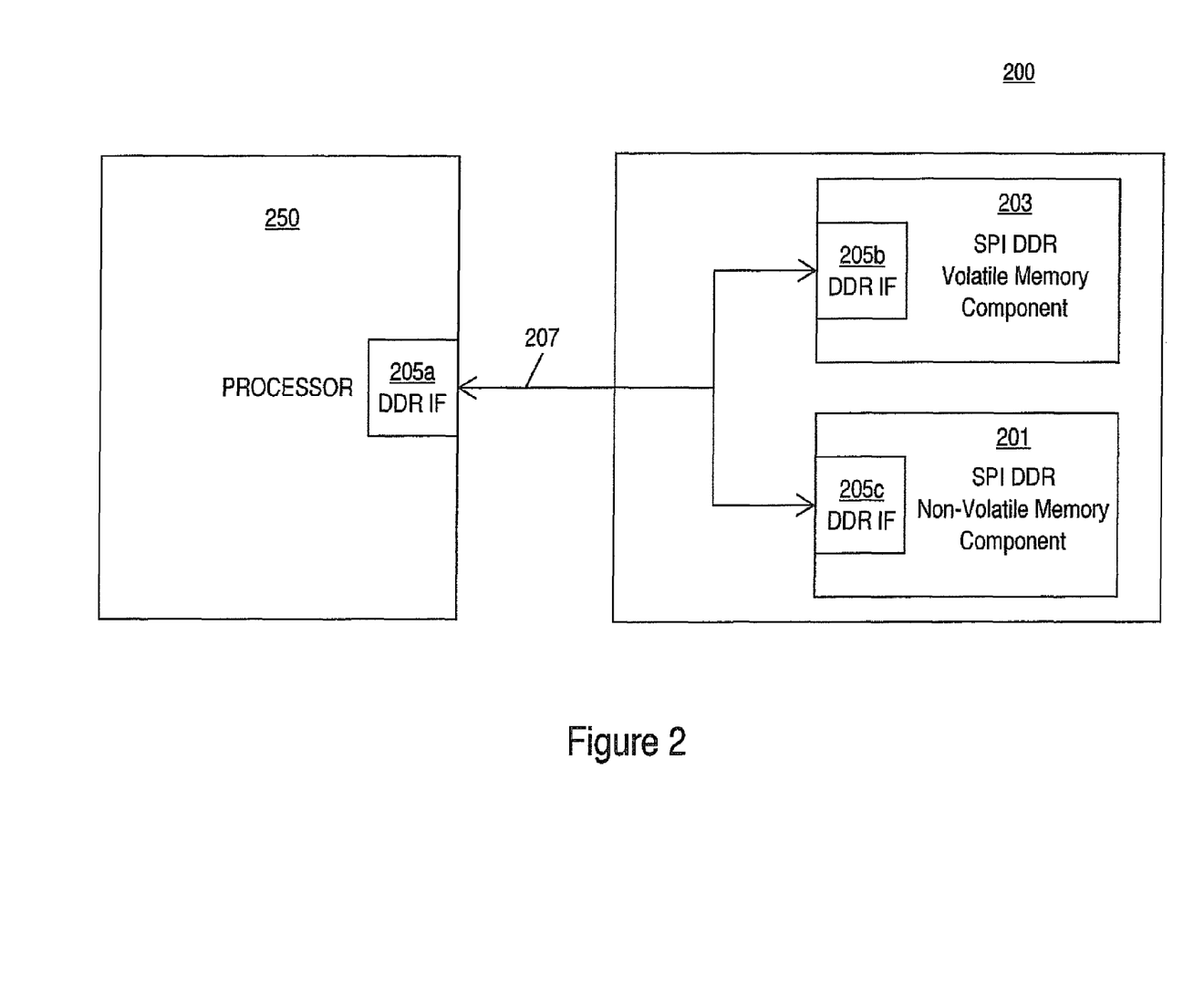
FIG. 2 shows an SPI memory subsystem according to one embodiment.

FIG. 2 shows components of SPI memory subsystem 200 according to one embodiment. In one embodiment, high speed SPI memory subsystem 200 includes a serial peripheral interface (SPI) double data rate (DDR) volatile memory component (e.g., NOR, NAND, PCM, etc. flash memory component) and a serial peripheral interface (SPI) double data rate (DDR) non-volatile memory component (e.g., DRAM, PSRAM, SRAM, etc.) that share the same bus. The serial infrastructure facilitates a reduction in the number of traces that are required to service the memory subsystem as compared to conventional systems that feature a parallel bus infrastructure. The reduction in the number of traces used to service the memory subsystem enables a reduction in the size of the die upon which the high speed SPI memory subsystem 200 is formed and a reduction in the size of the package that contains SPI memory subsystem 200 as compared to conventional systems. In the FIG. 2 embodiment, SPI memory subsystem 200 includes serial peripheral interface (SPI) double data rate (DDR) non-volatile memory component 201, serial peripheral interface (SPI) double data rate (DDR) volatile memory component 203, serial peripheral interface (SPI) double data rate (DDR) interfaces 205a, 205b and 205c and SPI bus 207. Also shown in FIG. 2 is processor 250.

Referring to FIG. 2, SPI DDR non-volatile memory component 201 stores data in flash memory cells that can be accessed at double data rate. In one embodiment, SPI DDR non-volatile memory component 201 can be enabled for access by SPI DDR interface 205c. Moreover, in one embodiment, the memory cells of SPI DDR non-volatile memory component 201 can be accessed via SPI DDR interface 205c on both rising and falling edges of a clock signal at double data rate. As the non-volatile data storage component of SPI memory subsystem 200, SPI DDR non-volatile memory component 201 does not lose data when SPI memory subsystem 200 is powered off. SPI DDR non-volatile memory component 201 is coupled to SPI DDR volatile memory component 203 by SPI bus 207.

SPI DDR volatile memory component 203 stores data in memory cells that can be accessed at double data rate. In one embodiment, SPI DDR volatile memory component 203 can be enabled for access by SPI interface 205b. Moreover, in one embodiment, as with the SPI DDR non-volatile memory component 201, memory cells of SPI DDR volatile memory component 203 can be accessed via SPI DDR interface 205b on both rising and falling edges of a clock signal at double data rate. SPI DDR volatile memory component 203 is the volatile data storage component of the SPI memory subsystem 200. SPI DDR volatile memory component 203 is coupled to SPI DDR non-volatile memory component 201 by SPI bus 207.

Processor 250 executes instructions and utilizes data that it accesses from SPI DDR non-volatile memory component 201 and SPI DDR volatile memory component 203. Instructions and data can be written into and read from SPI DDR non-volatile memory component 201 and SPI DDR volatile memory component 203 by processor 250 via SPI DDR interface 205a. In one embodiment, SPI DDR interface 205a can access memory cells (e.g., via SPI DDR interfaces 205b and 205c) on both the rising and falling edges of a clock cycle. Consequently, SPI subsystem 200 is able to achieve a high throughput performance that is similar to the performance achieved by subsystems with a parallel infrastructure.

Operation

In operation, when processor 250 seeks to access SPI DDR volatile memory component 203, SPI DDR interface 205b is prompted by processor 250 (via SPI DDR interface 205a) to enable SPI DDR volatile memory component 203 for access whereupon the desired memory location in SPI DDR volatile memory component 203 is accessed. Alternately, when processor 250 seeks to access SPI DDR non-volatile memory component 201, DDR interface 205c is prompted by processor 250 (via SPI DDR interface 205a) to enable SPI DDR non-volatile memory component 201 for access whereupon the desired memory location in SPI DDR non-volatile memory 201 is accessed. It should be appreciated that SPI DDR interfaces 205a, 205b and 205c enable SPI subsystem 200 to achieve a high speed throughput performance that is similar to the throughput that is provided by a conventional parallel NOR subsystem as is discussed above. However, SPI subsystem 200 provides the throughput advantages in addition to the low pin count benefit that is provided by the SPI protocol.

Comparisons with Conventional Systems

Figure 3:
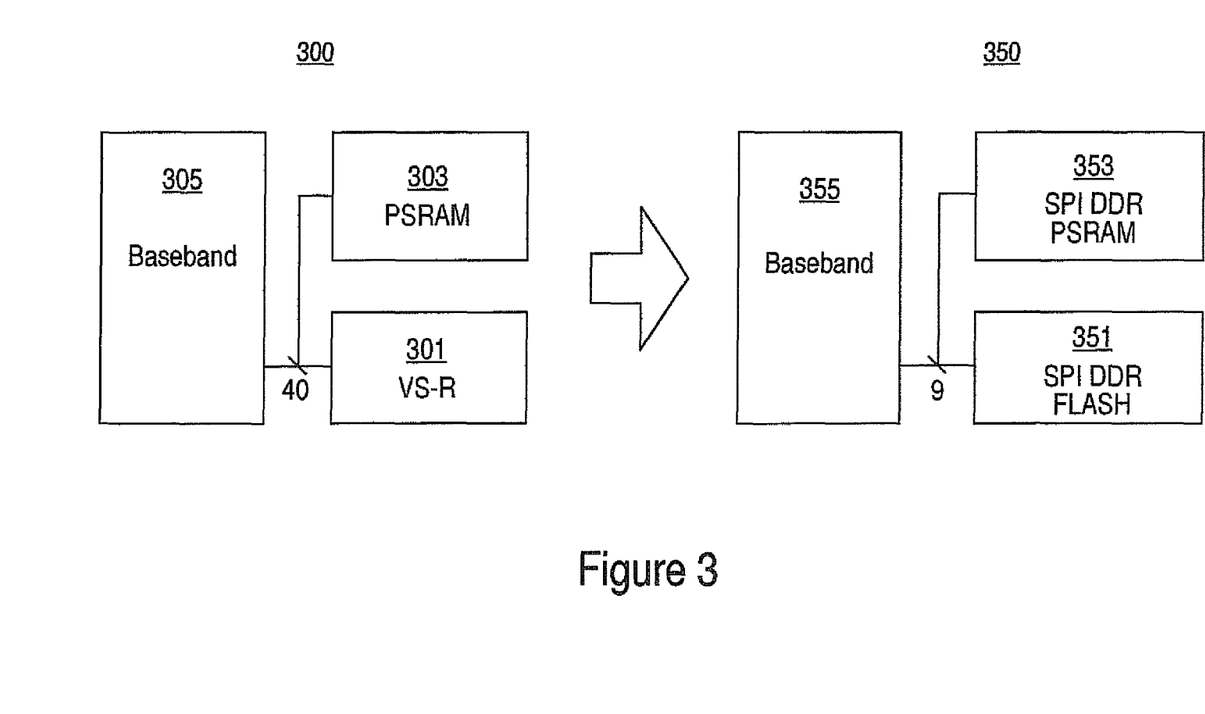
FIG. 3 illustrates differences in the structural composition of a conventional mobile baseband as compared to a mobile baseband structured in accordance with exemplary embodiments.

FIG. 3 illustrates differences between a conventional mobile baseband device and a mobile baseband device provided according to one embodiment. Referring to FIG. 3, conventional mobile baseband device 300 includes VS-R 301, PSRAM 303 and baseband processor 305. And, SPI DDR mobile baseband device 350, that is provided according to one embodiment, includes SPI DDR flash memory 351 (the non-volatile memory component), SPI DDR PSRAM 353 (the volatile memory component) and baseband processor 355. As illustrated in FIG. 3, SPI DDR mobile baseband device 350 is a 9 pin (7 active pin) structure that includes an SPI DDR (DSPI) flash memory component and an SPI DDR PSRAM (DPSRAM) memory component. This is contrasted with the conventional 40 pin parallel NOR flash mobile baseband device 300 shown in FIG. 3. In one embodiment, in SPI DDR mobile baseband 350, the seven active pins are 1 SCK, 4 I/O and 2 CE (not shown). In one embodiment, a separate CE is used to enable and disable the DSPI or DPSRAM.

Figure 4:
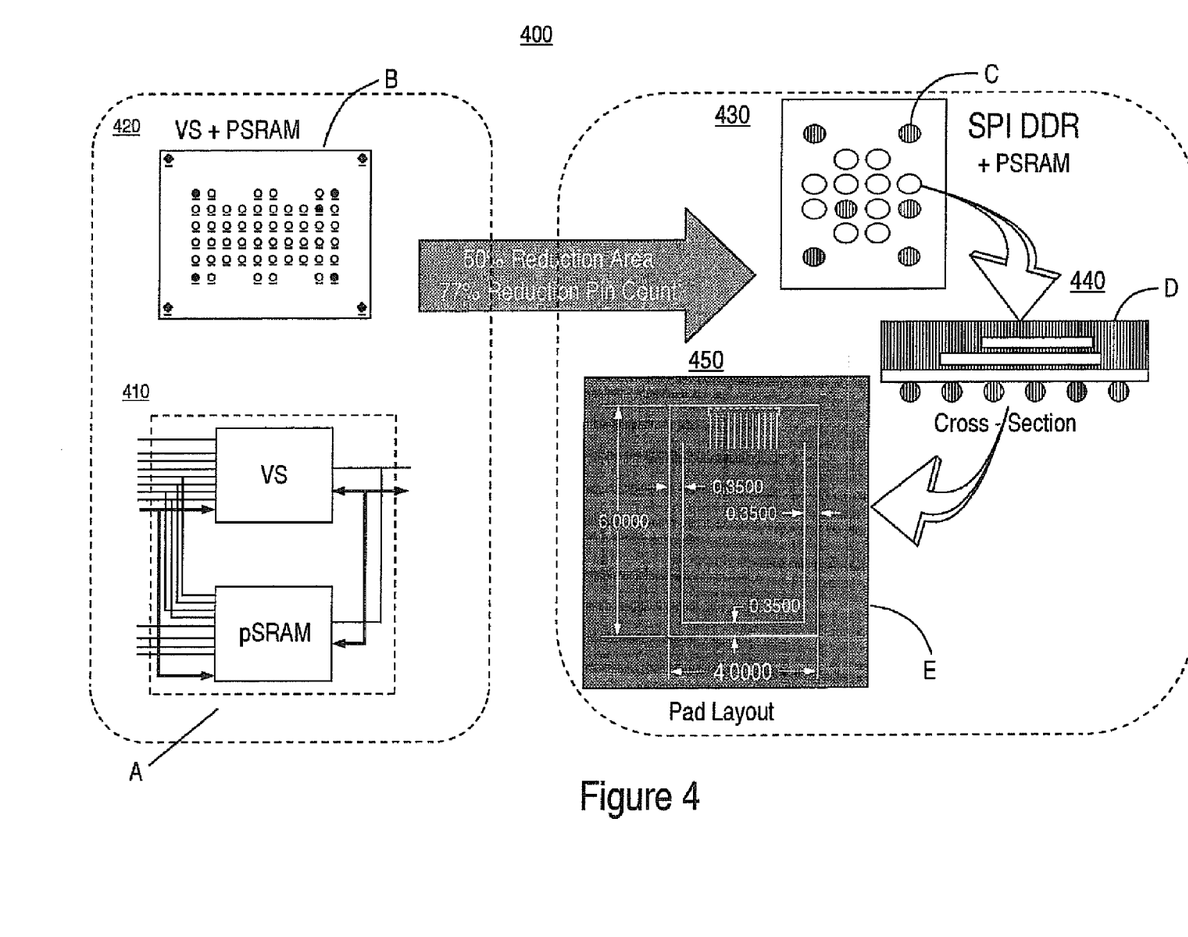
FIG. 4 shows a series of diagrams that illustrate the area and pin count differences of a conventional NOR multi-chip package as compared to a multi-chip package provided in accordance with exemplary embodiments.

FIG. 4 shows a series of diagrams 400 that illustrate the area and pin count differences of a conventional NOR multi-chip package as compared to a multi-chip package provided in accordance with exemplary embodiments. Referring to FIG. 4, at A, a block diagram 410 of a 40 pin parallel NOR flash memory subsystem that includes a PSRAM is shown and at B a diagram 420 of terminals of its multichip package is shown. Next, at C, a diagram 430 of the terminals of a multichip package provided in accordance with exemplary embodiments that features a 9 pin SPI DDR (DSPI) memory subsystem is shown. In one embodiment, the SPI DDR flash memory subsystem provides a 50 percent reduction in area and a 78 percent reduction in pin count. In other embodiments, other amounts of reduction in area and pin count can be provided. Referring again to FIG. 4, at D a cross section 440 of the multichip package that includes the 9 pin SPI DDR (DSPI) memory subsystem is shown, and, at E the pad layout 450 of the 9 pin SPI DDR (DSPI) memory subsystem is shown.

Exemplary Advantages of Embodiments

In one embodiment, a DDR interface (e.g., 205a, 205b and 205c in FIG. 2) is used to enable an SPI memory subsystem (e.g., 200 in FIG. 2) to achieve a throughput performance that is similar to that of a parallel NOR memory subsystem while maintaining the low pin count benefit of the SPI protocol. SPI flash architecture has conventionally involved a serial (single data in and single data out) device in an 8 pad configuration. Recently, the number of outputs provided by such devices has increased to include 4 signals (while maintaining 8 pads). These changes have improved performance, though not to the extent that the speed of such SPI flash subsystems equal that of burst-type parallel NOR flash memory interfaces. In contrast, using an SPI DDR interface, exemplary embodiments achieve a throughput performance that is similar to that offered by burst-type parallel NOR flash memory subsystems. In addition, the SPI DDR interface (e.g., 205a, 205b and 205c in FIG. 2) of exemplary embodiments can be used with existing SPI buses that are adapted to accommodate the interface. In one embodiment, flash and PSRAM components of the SPI DDR memory sub-system can have the same performance and follow the same protocol.

Other advantages provided by exemplary embodiments include a reduction in the number of pads that are used as compared to pads used by parallel NOR subsystems (40 or more to 9 for a 78 percent reduction in the number of pads used). Moreover, a performance advantage and pin savings of the SPI DDR configuration of one embodiment as compared to existing SDR (single data rate) SPI configurations is evidenced by the comparable performance of an exemplary dual I/O DDR bus (5 active pins) and a conventional quad I/O SDR bus (7 active pins). The lower pin count that is provided by exemplary embodiments has a direct effect on package size reduction. For example, in one embodiment, a 50 percent package size reduction is achieved, as regards a parallel NOR+PSRAM in a BGA44 (6.2×7.2 mm=77 mm$^2$) as compared to an exemplary DSPI+DPSRAM (6×4 mm=24 mm$^2$). Moreover, in exemplary embodiments, die size can continue to shrink since the flash is not pad limited—unlike a parallel NOR flash that uses 40 or more pads. In one embodiment, processors that are associated with exemplary memory subsystems can save die real estate since less control pads are used or the processor can utilize unused pads to support other features or functions.

Figure 5:
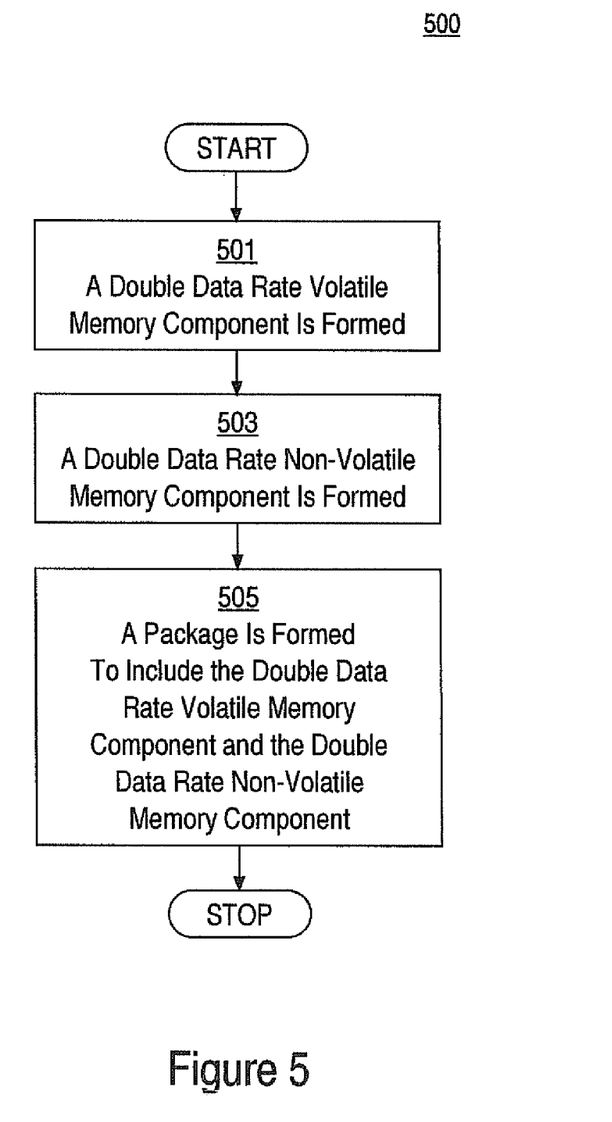
FIG. 5 shows a flowchart of the steps performed in a method for forming an SPI memory subsystem according to one embodiment.

Process for Forming High Speed Serial Peripheral Interface Memory Subsystem According to One Embodiment FIG. 5 shows a flowchart 500 of the steps performed in a method for forming a memory subsystem according to one embodiment. Although specific steps are disclosed in the flowcharts, such steps are exemplary. That is the present embodiments are well suited to performing various other steps or variations of the steps recited in the flowchart.

At 501, an SPI DDR volatile memory component is formed. In exemplary embodiments, the SPI DDR volatile memory component includes memory cells that can be accessed at double data rate. In one embodiment, the SPI DDR volatile memory component is formed to include an SPI DDR interface.

At 503, an SPI DDR non-volatile memory component is formed. In exemplary embodiments, the SPI DDR non-volatile memory component includes flash memory cells that can be accessed at double data rate.

At 505, a package is formed to include the SPI DDR non-volatile memory component and the SPI DDR volatile memory component. In one embodiment, the SPI DDR non-volatile memory component is formed to include an SPI DDR interface.

With reference to exemplary embodiments thereof, a memory subsystem is disclosed. The memory subsystem includes a serial peripheral interface (SPI) double data rate (DDR) volatile memory component, a serial peripheral interface (SPI) double data rate (DDR) non-volatile memory component coupled to the serial peripheral interface (SPI) double data rate (DDR) volatile memory component and a serial peripheral interface (SPI) double data rate (DDR) interface. The serial peripheral interface (SPI) double data rate (DDR) interface accesses the serial peripheral interface (SPI) double data rate (DDR) volatile memory component and the serial peripheral interface (SPI) double data rate (DDR) non-volatile memory component where data is accessed on leading and falling edges of a clock signal.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A memory subsystem, comprising:
a serial peripheral interface (SPI) double data rate (DDR) volatile memory component;
a SPI DDR non-volatile memory component coupled to the SPI DDR volatile memory component; and
a SPI DDR interface that accesses the SPI DDR volatile memory component and the SPI DDR non-volatile memory component, wherein the SPI DDR interface includes a plurality of parts distributed among respective separate components that include a processor, the SPI DDR volatile memory component and the SPI DDR non-volatile memory component, wherein the plurality of parts distributed among the separate components are a part of internal circuitry of the separate components, wherein the SPI DDR interface is operable to access data in the SPI DDR volatile memory component on leading and falling edges of a clock signal, and wherein the SPI DDR interface is operable to access data in the SPI DDR non-volatile memory component on leading and falling edges of the clock signal; and a stacked package comprising the SPI DDR volatile memory component stacked with the SPI DDR non-volatile memory component and a pin to enable or disable the SPI DDR volatile memory component or the SPI DDR non-volatile memory component, wherein the SPI DDR volatile memory component comprises an SPI DDR pseudostatic random access memory (PSRAM) and the SPI DDR non-volatile memory component comprises an SPI DDR flash memory.

2. The memory subsystem of claim 1 wherein the SPI DDR PSRAM and the SPI DDR flash memory share a same bus.

3. The memory subsystem of claim 1 wherein the package includes 9 pins.

4. The memory subsystem of claim 1 wherein the package includes 7 active pins.

5. The memory subsystem of claim 4 wherein the 7 active pins includes 2 chip enable (CE) pins.

6. The memory subsystem of claim 4 wherein the 7 active pins comprise 1 clock signal (SCK), 4 input/output (I/O), and 2 chip select pins (CE) pins.

7. An electronic device, comprising:
a processing subsystem; and
a memory subsystem, wherein the memory subsystem comprises:
   a serial peripheral interface (SPI) double data rate (DDR) volatile memory component;
   a SPI DDR non-volatile memory component coupled to the SPI DDR volatile memory component;
   a SPI DDR interface that accesses the SPI DDR volatile memory and the SPI DDR non-volatile memory, wherein the SPI DDR interface includes a plurality of parts distributed among respective separate components that include a processor, the SPI DDR volatile memory component and the SPI DDR non-volatile memory component, and wherein the plurality of parts distributed among the separate components are a part of internal circuitry of the separate components, wherein the SPI DDR interface is operable to access data in the SPI DDR volatile memory component on leading and falling edges of a clock signal, and wherein the SPI DDR interface is operable to access data in the SPI DDR non-volatile memory component on leading and falling edges of the clock signal; and
   a stacked package comprising the SPI DDR volatile memory component stacked with the SPI DDR non-volatile memory component and a pin to enable or disable the SPI DDR volatile memory component or the SPI DDR non-volatile memory component, wherein the SPI DDR volatile memory component comprises an SPI DDR pseudostatic random access memory (PSRAM) and the SPI DDR non-volatile memory component comprises a SPUI DDR flash memory.

8. The electronic device of claim 7 wherein the SPI DDR PSRAM and the SPI DDR flash memory share a same bus.

9. The electronic device of claim 7 wherein the package includes 9 pins.

10. The electronic device of claim 7 wherein the package includes 7 active pins.

11. The electronic device of claim 10 wherein the 7 active pins includes 2 chip enable (CE) pins.

12. The electronic device of claim 10 wherein the 7 active pins comprise 1 clock signal (SCK), 4 input/output (I/O), and 2 chip enable (CE) pins.

13. A method of forming a memory subsystem, comprising:
forming a serial peripheral interface (SPI) double data rate (DDR) volatile memory component;
forming a SPI DDR non-volatile memory component to be coupled to the SPI DDR volatile memory component; and
forming a SPI DDR interface for accessing the SPI DDR volatile memory component and the SPI DDR non-volatile memory component, wherein the SPI DDR interface includes a plurality of parts distributed among respective separate components that include a processor, the SPI DDR volatile memory component and the SPI DDR non-volatile memory component, wherein the plurality of parts distributed among the separate components are a part of the internal circuitry of the separate components that include a processor, the SPI DDR volatile memory component and the SPI DDR non-volatile memory component, and wherein the plurality of parts distributed among the separate components are a part of internal circuitry of the separate components, wherein data in the SPI DDR volatile memory component is accessed on leading and falling edges of a clock signal and data in the SPI DDR non-volatile memory component is accessed on leading and falling edges of the clock signal; and
forming a stacked package comprising the SPI DDR volatile memory component stacked with the SPI DDR non-volatile memory component and a pin to enable or disable the SPI DDR volatile memory component or the SPI DDR non-volatile memory component, wherein the SPI DDR volatile memory component comprises an SPI DDR pseudostatic random access memory (PSRAM) and the SPI DDR non-volatile memory component comprises an SPI DDR flash memory.

14. The method of claim 13 wherein the SPI DDR PSRAM and the SPI DDR flash memory share a same bus.

15. The method of claim 13 wherein the package includes 7 active pins.

16. The method of claim 15 wherein the 7 active pins includes 2 chip enable (CE) pins.

17. The method of claim 15 wherein the 7 active pins comprise 1 clock signal (SCK), 4 input/output (I/O), and 2 chip enable (CE) pins.

* * * * *